US009822227B2

(12) United States Patent
Bedner et al.

(10) Patent No.: US 9,822,227 B2
(45) Date of Patent: Nov. 21, 2017

(54) HIGH TG EPOXY FORMULATION WITH GOOD THERMAL PROPERTIES

(71) Applicant: Isola USA Corp., Chandler, AZ (US)

(72) Inventors: David Bedner, Chandler, AZ (US); Tarun Amla, Chandler, AZ (US)

(73) Assignee: Isola USA Corp., Chandler, AZ (US)

( * ) Notice: Subject to any disclaimer, the term of this patent is extended or adjusted under 35 U.S.C. 154(b) by 0 days.

(21) Appl. No.: 14/743,093

(22) Filed: Jun. 18, 2015

(65) Prior Publication Data

US 2016/0075839 A1  Mar. 17, 2016

Related U.S. Application Data

(60) Provisional application No. 62/051,051, filed on Sep. 16, 2014.

(51) Int. Cl.

| | |
|---|---|
| *C08J 5/24* | (2006.01) |
| *H05K 1/03* | (2006.01) |
| *H05K 3/00* | (2006.01) |
| *C09D 163/00* | (2006.01) |
| *C09D 7/12* | (2006.01) |
| *C09D 163/04* | (2006.01) |
| *H05K 1/18* | (2006.01) |
| *B32B 15/092* | (2006.01) |
| *B32B 15/20* | (2006.01) |
| *C08G 59/32* | (2006.01) |
| *C08G 59/50* | (2006.01) |
| *C08L 63/00* | (2006.01) |
| *C08L 63/04* | (2006.01) |
| *C09J 163/00* | (2006.01) |
| *C09J 163/04* | (2006.01) |

(52) U.S. Cl.
CPC .............. *C08J 5/24* (2013.01); *C08G 59/504* (2013.01); *C08G 59/5033* (2013.01); *C08L 63/00* (2013.01); *C08L 63/04* (2013.01); *C09D 163/00* (2013.01); *C09D 163/04* (2013.01); *C09J 163/00* (2013.01); *C09J 163/04* (2013.01); *H05K 1/0326* (2013.01); *H05K 3/00* (2013.01); *C08J 2363/04* (2013.01); *C08J 2463/00* (2013.01); *H05K 1/0373* (2013.01)

(58) Field of Classification Search
CPC ..... C08L 63/00–63/10; C09D 163/00–163/10; C09J 163/00–163/10; C08J 2463/00–2463/10; C08J 5/24; H05K 3/00; H05K 1/0326; H05K 1/0373; C08G 59/5033; C08G 59/504

See application file for complete search history.

(56) References Cited

U.S. PATENT DOCUMENTS

| | | | | |
|---|---|---|---|---|
| 4,550,128 | A | * | 10/1985 | Chellis ......................... 523/433 |
| 5,364,700 | A | * | 11/1994 | Domeier ................ C08F 22/40 428/367 |
| 6,204,456 | B1 | | 3/2001 | Lauffer et al. |
| 6,528,218 | B1 | | 3/2003 | Foster et al. |
| 7,070,861 | B2 | | 7/2006 | Taguchi |
| 2003/0135011 | A1 | | 7/2003 | Goto |
| 2003/0158337 | A1 | * | 8/2003 | Choate ............... C08G 59/4261 525/107 |
| 2010/0144965 | A1 | * | 6/2010 | Marks ................... C08G 59/18 524/612 |
| 2010/0163783 | A1 | * | 7/2010 | Fung et al. ..................... 252/73 |
| 2013/0126218 | A1 | * | 5/2013 | Gouzu et al. ................. 174/255 |
| 2013/0266812 | A1 | * | 10/2013 | Zeng et al. ................... 428/416 |
| 2014/0322541 | A1 | * | 10/2014 | Wang et al. .................. 428/418 |

OTHER PUBLICATIONS

Hexion, Epon SU-8 Technical Data Sheet (2015).*
DIC Corporation, EPICLON Standard Products Epoxy Resins and Curing Agents (2015).*
Scifinder properties of CAS 80-08-0 (2015).*
Scifinder properties of 68928-70-1 (2015).*
Hexion, Epikote 154 Data Sheet (2015).*
Chang Chun Plastics, BEB-400 MSDS (2015).*
Perry Chemical, Epoxy Resin Web Page (retrieved Jul. 28, 2015).*

* cited by examiner

*Primary Examiner* — Kregg T Brooks
(74) *Attorney, Agent, or Firm* — McDonnell Boehnen Hulbert & Berghoff LLP

(57) ABSTRACT

Varnish compositions and prepregs and laminates made therefrom wherein the varnish compositions include at least one first epoxy resin and at least one second epoxy resin that includes a bisphenol-A novolac epoxy resin and a harder wherein the at least one first epoxy resin and the at least one second bisphenol-A novolac epoxy resin are present in the varnish at a weight ratio ranging from about 1:1 to about 1:3.

6 Claims, No Drawings

HIGH TG EPOXY FORMULATION WITH GOOD THERMAL PROPERTIES

This application claims priority to U.S. provisional patent application No. 62/051,051, filed on Sep. 16, 2014, the specification of which is incorporated herein by reference.

BACKGROUND OF THE INVENTION

(1) Field of the Invention

This invention relates to varnish compositions used to make laminates and prepregs that are then used to manufacture printed circuit boards. This invention also is directed to laminates and prepregs made from the varnish compositions of this invention. The varnish compositions of this invention produce prepregs and laminates that possess excellent thermal and mechanical performance and especially excellent peel strengths.

(2) Description of the Art

There is a laminate phenomenon known as "pad cratering" in which a chip associated with a printed circuit board laminates can become dislodged. Pad cratering is a mechanically induced fracture in the resin between copper foil and outermost layer of fiberglass of a printed circuit board but which may be within the resin or at the resin to glass interface. The pad remains connected to the component (usually a Ball Grid Array, BGA) and leaves a "crater" on the surface of the printed circuit board. Pad cratering is believed to be caused by an accumulation of mechanical stress between the printed circuit board resin and copper. Thus, there is a need for prepregs and laminates used in printed circuit boards that reduce the propensity for the circuit boards to suffer from pad cratering.

SUMMARY OF THE INVENTION

Laminates and prepregs used in printed circuit boards that have a very high TMA Tg induce less mechanical stress in the circuit boards during thermal cycling. The reduction of mechanical stress should reduce the incidence of pad cratering. Making high Tg laminates typically requires the use of expensive varnish ingredients. The varnishes, prepregs and laminates of this invention have surprisingly high Tgs and are economical to make.

One aspect of this invention are varnishes used to manufacture prepregs and laminates that include a mixture of epoxy resins that unexpectedly improves the laminate Tg and thermal properties beyond what would be expected based upon the varnish ingredient properties. In this invention aspect, the varnish composition comprises: at least one first epoxy resin and at least one second epoxy resin that is a bisphenol-A novolac epoxy resin and a harder wherein the at least one first epoxy resin and the at least one second bisphenol-A novolac epoxy resin are present in the varnish at a weight ratio ranging from about 1.1 to about 1:3 and more narrowly at a weight ratio of from about 1:1.8 to about 1:2.0.

Another aspect of this invention is a varnish composition comprising: from about 20 wt % to about 50 wt % on an epoxy resin weight basis of a multi-functional epoxy resin; from about 25 wt % to about 60 wt % on an epoxy resin weight basis of an eight-functional bisphenol-A novolac epoxy resin; from about 20 wt % to about 50 wt % on an epoxy resin weight basis of a bifunctional epoxy resin; and a hardener, wherein the multi-functional epoxy resin and the eight functional bisphenol-A novolac epoxy resin are present in the varnish at a weight ratio ranging from about 1:1.8 to about 1:2.0.

Still another aspect of this invention are prepregs and or laminates made using one or more prepreg layers of this invention wherein the prepreg comprises a b-staged varnish including at least one first epoxy resin and at least one second epoxy resin that is a bisphenol-A novolac epoxy resin and a harder wherein the at least one first epoxy resin and the at least one second bisphenol-A novolac epoxy resin are present in the varnish at a weight ratio ranging from about 1:1 to about 1:3.

Yet another aspect of this invention are prepregs comprising a b-staged varnish composition including: from about 20 wt % to about 50 wt % on an epoxy resin weight basis of a multi-functional epoxy resin; from about 25 wt % to about 60 wt % on an epoxy resin weight basis of an eight-functional bisphenol-A novolac epoxy resin; from about 20 wt % to about 50 wt % on an epoxy resin weight basis of a bifunctional epoxy resin; and a hardener, wherein the multi-functional epoxy resin and the eight functional bisphenol-A novolac epoxy resin are present in the varnish at a weight ratio ranging from about 1:1.8 to about 1:2.0.

In a further aspect, this invention is a varnish composition comprising an epoxy resin mixture consisting of a combination of three epoxy resins. The varnish composition will further include a hardener and optionally one or more additional ingredients wherein the combination of three epoxy resins consists of from about 20 wt % to about 50 wt % on an epoxy resin weight basis of a multi-functional epoxy resin; from about 25 wt % to about 60 wt % on an epoxy resin weight basis of an eight-functional bisphenol-A novolac epoxy resin; from about 20 wt % to about 50 wt % on an epoxy resin weight basis of a bifunctional epoxy resin; wherein the multi-functional epoxy resin and the eight functional bisphenol-A novolac epoxy resin are present in the varnish at a weight ratio ranging from about 1:1.8 to about 1:2.0.

In the aspects set forth above, the varnish is optionally used to impregnate a woven fabric material and thereafter the varnish is partially cured (b-staged) to form a prepreg or it is completely cured (c-staged) to form a laminate.

Prepregs and laminates prepared using the varnishes of this invention surprisingly can have a DMA Tg in excess of 280° C. and a T288 in excess of 20 minutes.

DESCRIPTION OF CURRENT EMBODIMENTS

This invention is directed generally to varnishes made from a plurality of ingredients as well as to prepregs and laminates made using the varnishes of this invention.

The varnish ingredient amounts are given below as wt % amounts. However, the wt % amounts are given on several different bases. In general, and unless indicated otherwise, the wt % amounts are reporting on a solvent free or "dry" basis. In some instances below, the varnish epoxy resin ingredients are reported in wt % based upon the cumulative weight of all epoxy resin ingredients. This is referred to as wt % on an "epoxy resin weight basis". In other instances, varnish ingredient weight percent's are reported based upon the total varnish or laminate weight (on a dry basis) and includes the weight of all varnish ingredients including, for example, fillers, flame retardants and so forth—but not including any core materials such as woven glass, felt or ground up fiber materials. This weight percent is referred to below as wt % on a "total laminate weight basis".

Varnishes of this invention are made by a "compounding" process where a resin ingredient is combined with other ingredients to form a thermosettable varnish. The varnish is then used to manufacture a laminate. The varnish can be used to manufacture a laminate by "impregnating" a core material such as a woven glass fabric with the varnish. Alternatively, the varnish can be used to coat a copper sheet to form a resin coated copper sheet or laminate or the varnish can be used to form a laminate sheet that does not have a core material. The laminates made from the varnishes of this invention are useful as a prepreg—i.e., partially cured or "b-stage" form—and in a completely cured "c-stage" form. The ingredients used to formulate the varnishes of this invention are discussed in more detail below. Unless stated otherwise, the composition ingredient weight percent ranges and varnish ingredient weight percent ranges are reported on a dry or solvent free basis.

The varnishes of this invention may include mixtures of epoxy resins having different functionalities. The term "multi-functional epoxy" refers to an epoxy resin having 3 or more oxirane groups per molecule and more preferably from 3 up to about 8 oxirane groups per molecule. The term "bi-functional epoxy resin" refers to an epoxy resin having two oxirane groups per molecule.

The varnishes of the invention include at least one epoxy resin and at least one bisphenol-A novolac epoxy resin wherein the at least one epoxy resin and at least one bisphenol-A novolac epoxy resin are present in the varnish at a weight ratio ranging from about 1:2.5 to about 1:1. The term "bisphenol-A novolac epoxy resin" refers to generally to epoxy resins that have the following formula:

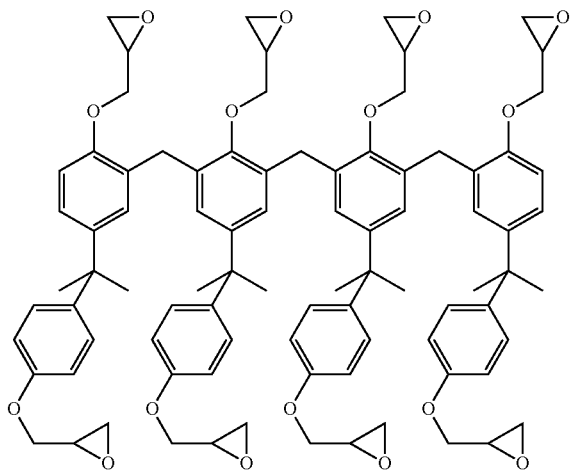

During resin manufacture, there can be some variation in the formula of the resins that are contained in the resin. For example the bisphenol-A novolac epoxy resin above will be predominantly monomers having 8-functional groups but due to manufacturing variability the resin will include some monomers with seven functional groups, six functional groups and so forth. In addition, some of the monomers can include 3 or 5 of the repeating groups instead of the four shown in the formula above. By "predominantly" it is meant that at least 80% and preferably at least 90% and more preferable at least 95% of the monomers of bisphenol-A novolac epoxy resin will have the four repeating groups and include 8-functional groups as shown in the formula above.

In another aspect of this invention, other epoxy resins used in the varnishes for manufacturing prepregs and laminates will also be predominantly monomers having the same formula where the term "predominantly" has the same definition as set forth above.

In another embodiment, the varnishes of this invention will include a first epoxy resin that is preferably a multi-functional epoxy, a second bisphenol-A novolac epoxy resin and a third epoxy resin. In this embodiment, the third epoxy resin may be mono-functional, bi-functional or multi-functional with a bi-functional epoxy resin being preferred. In all embodiments, the second bisphenol-A novolac epoxy resin may be monofunctional, bi-functional or multi-functional. In a preferred aspect, the second bisphenol-A novolac epoxy resin will be multi-functional epoxy and preferably it will have 8 oxirane groups per molecule.

In general, the first epoxy resin will be present in the varnish in an amount ranging from about 20 to about 60 wt % based upon the weight of all epoxy ingredients weight—"epoxy resin weight basis". If the varnish includes a first epoxy resin and a third epoxy resin, the first and third epoxy resins will each be present in the varnish in an amount ranging from about 30 to about 65 wt % on an epoxy resin weight basis and the second epoxy resin, the bisphenol-A novolac epoxy resin, will be present in the varnish in an amount ranging from about 25 to about 60 wt % on an epoxy resin weight basis. In one embodiment, when a first epoxy resin and second epoxy resin are used together in the formulation then they will be present together in an amount ranging from about 40 to about 75 wt % on an epoxy resin weight basis.

The resin compositions of this invention will further include a hardener that reacts with the epoxy groups to harden or cross-link the discrete epoxy resin molecules. In one embodiment, the hardener is an aromatic amine. Some preferred aromatic amine hardeners include 4,4' DDS—4, 4'-diaminodiphenylsulfone, 3,3' DDS—3,3'-diaminodiphenylsulfone and mixtures thereof. The one or more aromatic amine hardeners will typically be present in the varnish of this invention in an amount ranging from about 2.0 to about 25 wt % on a total laminate weight basis—including fillers.

Flame Retardants

The compounded varnishes of this invention may include one or more flame retardants. Any flame retardant that is known to be useful in resin compositions used to manufacture composites and laminates use to manufacture printed circuit boards may be used. The flame retardants may contain halogens or they may be halogen free. Examples of useful flame retardants include, but are not limited to, halides of glycidyl etherified bifunctional alcohols, halides of novolac resins such as bisphenol A, bisphenol F, polyvinylphenol or phenol, creosol, alkylphenol, catecohl, and novolac resins such as bisphenol F, inorganic flame retardants such as antimony trioxide, red phosphorus, zirconium hydroxide, barium metaborate, aluminum hydroxide, and magnesium hydroxide, and phosphor flame retardants such as tetraphenyl phosphine, tricresyl-diphenyl phosphate, triethylphosphate, cresyldiphenylphosphate, xylenyl-diphenyl phosphate, acid phosphate esters, ammonia phosphate, ammonia polyphosphate, ammonia cyanurate, phosphate compounds containing nitrogen, and phosphate esters containing halides.

The phosphor flame retardants may include, for example those disclosed in U.S. Pat. Nos. 6,645,631, 7,687,556 and 8,129,456 the specifications of each of which is incorporated herein by reference.

Flame retardants will be present in the resin compositions of this invention in an amount sufficient to allow laminates made from the resin compositions to pass the UL-94 flammability test.

In one preferred embodiment, the flame retardant is the solid flame retardant decabromodiphenylethane, which has the following structure:

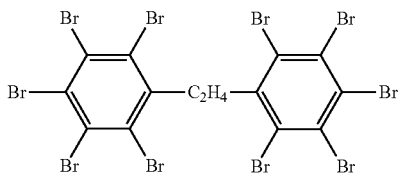

Decabromodiphenylethane is commercially available, for example, from Albemarle Corporation (451 Florida St., Baton Rouge, La. 70801). The Albemarle product is sold as Saytex™ 8010. Another useful high bromine content insoluble flame retardant is ethylenebistetrabromophthalimide which is sold as Saytex BT93W by Albemarle Corporation. Other similar useful flame retardants include decabromodiphenyl oxide and brominated polystyrene.

A flame retardants or combinations thereof may be present in the varnish in an amount ranging from about 5% to about 50%, or from about 5% to about 20% on a total dry laminate weight basis.

Initiators/Catalysts

The varnishes of this invention may include initiators or catalysts that promote varnish cross-linking typically when the varnish is heated. Useful initiators/catalysts are Lewis acids such as $BF_3$-MEA.

The amount of initiator used depends upon its application. When used in a varnish, the initiator will be present in an amount ranging from about 2.0 to about 25 wt % or alternatively from about 0.5 to about 3.0 wt % on a total laminate weight basis.

In another embodiment, the varnishes of the invention will generally have the following ingredients in the recited amounts where the amounts are reported in parts by weight on a total laminate weight basis.

| Varnish Ingredient | Varnish Formula (parts by weight) |
| --- | --- |
| Flame retardant - | 10-70 |
| Optional filler | 0-50 |
| Glicydyl ether of a bisphenol A novolac (epoxy) | 80-150 |
| Multifunctional epoxy | 30-60 |
| Bi-functional epoxy | 30-60 |
| Hardener | 20-50 |
| Optional rubber | 0-5 |
| Optional Lewis acid | 0-5 |

In an alternative embodiment, the varnishes of the invention will generally have the following ingredients in the recited amounts where the amounts are reported in parts by weight on a total laminate weight basis.

| Component Name | Varnish Ingredient | Varnish Formula - parts by weight |
| --- | --- | --- |
| Saytex 8010 | Brominated flame retardant - decabromodiphenylethane | 40-60 |
| Megasil 525 | Crystalline silica filler | 0-50 |
| XZ 92757 X75 | Glicydyl ether of a bisphenol A novolac (8-functional group epoxy) | 85-135 |
| Epon 1031 A70 | Multifunctional epoxy | 30-60 |
| DER 838 B90 | Bi-functional epoxy | 30-60 |
| 4,4'DDS | Aromatic amine hardener | 20-50 |
| Nipol rubber | Rubber | 0-5 |
| $BF_3$—MEA | Lewis Acid | 0-5 |

Solvents

One or more solvents are typically incorporated into the varnish compositions of this invention in order to solubilize the appropriate varnish composition ingredients, and or to control varnish viscosity, and/or in order to maintain the ingredients in a suspended dispersion. Any solvent known by one of skill in the art to be useful in conjunction with thermosetting resin systems can be used. Particularly useful solvents include methylethylketone (MEK), toluene, dimethylformamide (DMF), or mixtures thereof.

When used, solvents are present in the varnish in an amount of from about 20% to about 50% as a weight percentage of the total weight of the composition.

Optional Ingredients (a) Fillers

One or more fillers can optionally be added to the resin compositions of this invention to improve chemical and electrical properties of the cured resin. Examples of properties that can be modified with fillers include, but are not limited to, coefficient of thermal expansion, increasing modulus, and reducing prepreg tack. Non-limiting examples of useful fillers include particulate forms of Teflon®, Rayton®, talc, quartz, ceramics, particulate metal oxides in amorphous or crystalline form such as silica, titanium dioxide, alumina, ceria, clay, boron nitride, wollastonite, particulate rubber, PPO/PolyPhenylene Oxide and mixtures thereof. Other examples of useful fillers include calcined clay, fused silica and combinations thereof. Yet other useful fillers are silane treated silica and reclassified silica. When used, fillers are present in the compounded varnish of this invention in an amount from greater than 0% to about 40 wt %, preferably from greater than 0 to about 20 wt %, based on 100% by weight solids of the composition.

(b) Tougheners

The thermosetting resin compositions of this invention may include one or more tougheners. The tougheners are added to the resin compositions to improve the drillability of the resulting composites and laminates. Useful tougheners include methyl methacrylate/butadiene/styrene copolymer, methacrylate butadiene styrene core shell particles, carboxyl terminated butyl nitride, amino terminated butyl nitride and mixtures thereof. When used, tougheners are present in the thermosetting resin compositions of this invention in an amount from about 1% to about 5%, preferably from about 2 to about 4%, based on 100% by weight solids of the laminate.

(c) Other Optional Ingredients

Optionally, the compounded varnish may also contain other additives such as defoaming agents, leveling agents, dyes, and pigments. For example, a fluorescent dye can be added to the resin composition in a trace amount to cause a laminate prepared therefrom to fluoresce when exposed to UV light in a board shop's optical inspection equipment. A useful fluorescent dye is a highly conjugated diene dye. One example of such a dye is 2,5-thiophenediylbis(5-tert-butyl-1,3-benzoxazole.

Other optional ingredients known by persons of skill in the art to be useful in resins that are used to manufacture printed circuit board laminates may also be included in the resin compositions of this invention.

Prepregs and Laminates

The varnishes described above are useful for preparing prepregs and/or laminates used in the manufacture of printed circuit boards. In order to be useful in manufacturing printed circuit boards the laminates can be partially cured or b-staged in which state they can be laid up with additional material sheets to form a c-staged or fully cured laminate sheet. Alternatively, the resins can be manufactured into c-staged or fully cured material sheets.

In one useful processing system, the resin compositions of this invention are useful for making prepregs in a batch or in a continuous process. Prepregs are generally manufactured using a core material such as a roll of woven glass web (fabric) which is unwound into a series of drive rolls. The web then passes into a coating area where the web is passed through a tank which contains the thermosetting resin system of this invention, solvent and other components where the glass web becomes saturated with the resin. The saturated glass web is then passed through a pair of metering rolls which remove excess resin from the saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll The woven glass web can replaced with a woven fabric material, paper, plastic sheets, felt, and/or particulate materials such as glass fiber particles or particulate materials.

In another process for manufacturing prepreg or laminate materials, thermosetting resins of this invention are pre-mixed in a mixing vessel under ambient temperature and pressure. The viscosity of the pre-mix is ~100-500 cps and can be adjusted by adding or removing solvent from the resin. Fabric substrate (typically but not limited to E glass) is pulled through a dip tank including the premixed resin, through an oven tower where excess solvent is driven off and the prepreg is rolled or sheeted to size, layed up between Cu foil in various constructions depending on glass weave style, resin content & thickness requirements.

The thermosetting resin (varnish) mix can also be applied in a thin layer to a Cu foil substrate (RCC—resin coated Cu) using slot-die or other related coating techniques.

The varnishes, prepregs and resin coated copper foil sheets described above can be used to make laminates in batch or in continuous processes. In exemplary continuous process for manufacturing laminates of this invention, a continuous sheet in the form of each of copper, a resin prepreg and a thin fabric sheet are continuously unwound into a series of drive rolls to form a layered web of fabric, adjacent to the resin prepreg sheet which is adjacent to a copper foil sheet such that the prepreg sheet lies between the copper foil sheet and the fabric sheet The web is then subjected to heat and pressure conditions for a time that is sufficient to cause the resin to migrate into the fabric material and to completely cure the resin. In the resulting laminate, the migration of the resin material into the fabric causes the thickness of the resin layer (the distance between the copper foil material and the fabric sheet material to diminish and approach zero as combination layers discussed above transforms from a web of three layers into a single laminate sheet. In an alternative to this method, a single prepreg resin sheet can be applied to one side of the fabric material layer and the combination sandwiched between two copper layers after which heat and/or pressure is applied to the layup to cause the resin material to flow and thoroughly impregnate the fabric layer and cause both copper foil layers to adhere to the central laminate.

In still another embodiment, the resin coated copper sheets can be made at the same time the laminate is being made by applying a thin coating of resin to two different continuously moving copper sheets, removing any excess resin from the sheets to control the resin thickness and then partially curing the resin under heat and/or pressure conditions to form a sheet of b-staged resin coated copper. The sheet(s) of b-staged resin coated copper can then be used directly in the laminate manufacturing process.

In yet another embodiment, the fabric material—with or without prior pretreatment—can be continuously fed into a resin bath such that the fabric material becomes impregnated with the resin. The resin can be optionally partially cured at this stage in the process. Next, one or two copper foil layers can be associated with the first and/or second planar surface of the resin impregnated fabric sheet to form a web after which heat and/or pressure is applied to the web to fully cure the resin.

EXAMPLE 1

A varnish having the following formulation was combined with 15-45 parts of dimethylformamide (DMF) solvent.

TABLE 1

| Component Name | | Varnish Formula - parts (wt %) |
|---|---|---|
| Saytex 8010 | Brominated Flame retardant - decabromodiphenylethane | 36 (18.1%) |
| Megasil 525 | Crystalline silica filler | 39 (7.3) |
| XZ 92757 X75 | Glicydyl ether of a bisphenol A novolac (having 8 functional groups) | 105 (33.3%) |
| Epon 1031 A70 | Multifunctional epoxy (tetra-functional) | 45 (14.3%) |
| DER 383 B90 | Bi-functional epoxy | 45 (14.3%) |
| 4,4'DDS | Aromatic amine | 36 (11.4%) |
| Nipol rubber | Rubber | 1.9 (0.6%) |
| $BF_3$—MEA | Lewis Acid | 2.4 (0.7%) |
| Totals | | 315.1 (100%) |

The varnish was used to impregnate a woven sheet of "e" glass. However, alternatives to e glass such as "s" glass or "low Dk" "quartz" woven and/or matte glass cloth can be used.

The impregnation was performed manually. The woven glass cloth was dipped in the varnish for a period of time ranging from about 5 seconds to about 60 seconds then the solvents were driven off in a forced air oven for 1 to 5 minutes operating at between 300° F. and 400° F. The varnish impregnated woven glass cloth was then removed from the varnish and cured under pressure (50-400 psi) and held at 350° F.-450° F. for a minimum of 30 minutes and a maximum of 180 minutes to form a fully cured laminate. The properties of the fully cured laminate are reported below:

TABLE 2

| Test | Result |
| --- | --- |
| TMA CTE | 245° C. (2.1% exp) |
| DMA (Tg) | >280° C. |
| DSC (Tg) | >235° C. |
| T260 | >60 min |
| T288 | 20 min |
| Solder Float | 1000 s |
| Peels condition "B" ½ WS/B | 6.7/4.3 |
| Total Burn/Longest Burn | 5/3 |

An alternative varnish formulation used to form a laminate is set forth in Table 3 below. The properties of the laminate produced with the alternative varnish formulation are similar to those reported above.

TABLE 3

| Component Name | Chemical Name | Varnish Total Wt. including solvent | Laminate Solids Wt. |
| --- | --- | --- | --- |
| DMF | Polar Solvent | 46 (12.47) | — |
| Saytex 8010 | Brominated Flame retardant - decabromodiphenylethane | 57 (15.45) | 57 (20.89) |
| Megasil 525 | Crystalline silica filler (optional) | 23 (6.23) | 23 (8.43) |
| XZ 92757 X75 | Glicydyl ether of a bisphenol A novolac having eight functional groups | 105 (28.46) | 78.75 (28.86) |
| Epon 1031 A70 | Multifunctional epoxy | 45 (12.20) | 31.5 (11.54) |
| DER 838 B90 | Bi-functional epoxy | 45 (12.20) | 40.5 (14.84) |
| 4,4'DDS | Aromatic amine | 36 (9.76) | 36 (13.19) |
| Nipol 1472X-P25 | Rubber (optional) | 7.7 (2.09) | 1.93 (0.71) |
| BYK-310 | Surfactant (optional) | 1.8 (0.49) | 1.8 (0.66) |
| BF3—MEA | Lewis Acid | 2.4 (0.65) | 2.4 (0.88) |
| Totals | | 368.9 | 272.9 |

EXAMPLE 2

The following varnishes A-H were prepared according to Table 4 below:

TABLE 4

| Component | A (parts) | B (parts) | C (parts) | D (parts) | E (parts) | F (parts) | G (parts) | H (parts) |
| --- | --- | --- | --- | --- | --- | --- | --- | --- |
| Bi-Functional Epoxy | 41.6 DER | 38 DER | 54 DER | 29.2 DER | 300 DER | 112.1 DER | 61.8 DER3 | |
| Glycidyl Ether Epoxy | | 14.1 XZ9 | | 31.7 XZ9 | | 218.3 XZ9 | | 40.2 XZ9 |
| Hardener | 100 BENA | 100 BENA | 30.3 BENB | 39.9 BENB | 100 DDS | 100 DDS | 100 BENB | 100 BENB |
| Hardener | | | 100 SMA | 100 SMA | | | | |

In Table 4;
SMA = styrene maleic anhydride;
BENA = benzoxazine based upon phenolphthalein;
BENB = benzoxazine based upon bisphenol-A;
DDS = 4,4'-diaminodiphenylsulfone;
DER = DER383 a bifunctional epoxy resin;
XZ9 = XZ92757 - an 8 functional glycidyl ether epoxy resin.

The ingredients of varnishes A-H above were combined with the solvent DMF and a Lewis acid ($BF_3$-MEA) to form a thermosetting varnish. Each varnish was used to impregnate a woven sheet of "e" glass. The impregnation was performed manually. The woven glass cloth was dipped in the varnish for a period of time ranging from about 5 seconds to about 60 seconds then the solvents were driven off in a forced air oven for 1 to 5 minutes operating at between 300° F. and 400° F. The varnish impregnated woven glass cloth was then removed from the varnish and cured under pressure (50-400 psi) and held at 350° F.-450° F. for a minimum of 30 minutes and a maximum of 180 minutes to form a fully cured laminate.

Table 5 below compares some physical properties of the laminates made using each varnish.

TABLE 5

| Property | A | B | C | D | E | F | G | H |
| --- | --- | --- | --- | --- | --- | --- | --- | --- |
| DSC (° C.) | 200 | 192 | | | | | | |
| DMA (° C.) | 220 | 210 | 195 | 193 | 237 | 302 | | |
| T288 (min) | | | | | 9 | 20 | | |
| TMA (° C.) | | | | | 209 | 252 | 159 | 192 |
| T260 (min) | | | | | | | 60 | 26 |

In Table 5,
DMA = Dynamic mechanical analysis of Tg.
T288 = Time to delamination at 288° C.
T260 = Time to delamination at 260° C.
TMA = Thermal mechanical analysis.
DSC = Differential scanning calorimetry.

The physical properties of the laminates made with varnishes A-H are compared side-by-side in Table 6 below.

TABLE 6

| Varnish Comparison | TMA | DMA | DSC | T288 |
| --- | --- | --- | --- | --- |
| A/B | No effect | No effect | No effect | No effect |
| C/D | No effect | −20 C. | −30 C. | +20 min |
| E/F | +47 C. | +60 C. | +36 C. | +20 min |
| G/H | +40 C. | +50 C. | +50 C. | −30 min |

The c-staged laminate physical property results reported in Table 6 demonstrate that there is an unexpected weight combination of the bi- and/or multi-functional epoxy resin ingredient and glycidyl ether of bisphenol A novolac ingredient that, when combined to form a varnish used to manufacture an electrical laminate material produces laminates with unexpectedly high Tg's (DMA Tg and DSC Tg), good T288 times (time to delamination) and TMA results. The Tg results are important because laminate expansion accelerates as the laminate temperature approaches the laminate Tg. Therefore, the higher the laminate Tg, the more heat the laminate can endure without exhibiting unwanted expansion that can damage printed circuit board electrical components and connections. One or more of these favorable results tends to degrade according to Table 6 as the amount of either epoxy ingredient in the varnish approaches 0 parts.

The foregoing description of the specific embodiments will reveal the general nature of the disclosure so others can, by applying current knowledge, readily modify and/or adapt for various applications such specific embodiments without departing from the generic concept, and therefore such adaptations and modifications are intended to be comprehended within the meaning and range of equivalents of the disclosed embodiments. It is to be understood that the phraseology or terminology herein is for the purpose of description and not of limitation.

What is claimed is:

1. A prepreg comprising a b-staged varnish composition including:
    30-60 parts by weight of a multi-functional epoxy wherein the multi-functional resin is not an eight-functional bisphenol-A novolac epoxy resin;
    80-150 parts by weight of an eight-functional bisphenol-A novolac epoxy resin;
    30-60 parts by weight of a bifunctional epoxy resin;
    20-50 parts by weight of a hardener selected from 4,4'-diaminodiphenylsulfone, 3,3'-diaminodiphenylsulfone and mixtures thereof; and
    10-70 parts by weight of a flame retardant wherein the prepreg is capable of being c-staged to a composite having a DMA Tg in excess of 280° C. and a T288 time in excess of 20 minutes.

2. The prepreg of claim 1 wherein the multifunctional epoxy resin and the eight functional bisphenol-A novolac epoxy resin are present in the varnish at a weight ratio ranging from about 1:1.8 to about 1:2.0.

3. The prepreg of claim 1 wherein the hardener is 4,4'-diaminophenylsulfone.

4. The prepreg of claim 1 wherein the at least one flame retardant is decabromodiphenylethane.

5. A printed circuit board including at least one layer that is a c-staged prepreg of claim 1.

6. A prepreg comprising a b-staged varnish composition including:
    30-60 parts by weight of a multi-functional epoxy resin wherein the multi-functional resin is not an eight-functional bisphenol-A novolac epoxy resin;
    80-150 parts by weight of an eight-functional bisphenol-A novolac epoxy resin;
    30-60 parts by weight of a bifunctional epoxy resin;
    20-50 parts by weight of a hardener selected from 4,4'-diaminodiphenylsulfone, 3,3'-diaminodiphenylsulfone and mixtures thereof;
    10-70 parts by weight of a flame retardant;
    0-50 parts of a filler;
    0-5 parts of a rubber; and
    0-5 parts of a Lewis acid wherein the prepreg is capable of being c-staged to a composite having a DMA Tg in excess of 280° C. and a T288 time in excess of 20 minutes.

* * * * *